SOLID STATE REACTIVE PHASE LAGGING DEVICE

Filed Dec. 27, 1961 2 Sheets-Sheet 1

INVENTOR.
James J. Murray
BY
S. J. Rotondi & A. T. Dupont

INVENTOR.
James J. Murray
BY
S. J. Rotondi & A. J. Dupont

United States Patent Office 3,122,655
Patented Feb. 25, 1964

3,122,655
SOLID STATE REACTIVE PHASE LAGGING DEVICE
James J. Murray, 809 Hudson St., Durham, N. C.
Filed Dec. 27, 1961, Ser. No. 162,617
5 Claims. (Cl. 307—88.5)
(Granted under Title 35, U.S. Code (1952), sec. 266)

The invention described herein may be manufactured and used by or for the Government for governmental purposes without the payment to me of any royalty thereon.

This invention relates to the application of semiconductor principles in a new geometrical configuration to effect and devise a new electrical characteristic, namely a reactive semiconductor inductance which can be useful in many present tuning circuits. The invention further relates to the application of electron flow in a semiconductor to generate hole flow so as to effect a phase change in current or potential.

A semiconductor is known as a material that has a conductivity or resistivity somewhat between that of a good conductor, such as copper, and a good insulator, such as mica or the like. Many materials fit this description, with germanium, silicon, lead sulfide, lead telluride, indium arsenide and copper oxide, being a few examples. Most of the semiconductor devices are made from the elemental germanium and silicon rather than from the compounds due to the ease of achieving a known small degree of impurity content in a simple one-atom structure. The impurities may be present in the material as cast or may be added during the fabrication of the material.

Semiconductors of the type presently employed are generally of the class known as extrinsic. The basic material of the semiconductor contains a small amount of significant impurities which results in an excess of either electrons or holes. These semiconductors are commonly referred to as doped, and if the dominant significant impurities are of the donor class, the material is denoted as an N-type, while if the dominant significant impurities are of the acceptor class, the material is denoted as a P-type. Conduction in such a material is due to the presence and flow of the carriers introduced by the impurities.

Generally in the semiconductor art only low-level conditions are assumed to prevail and current densities, voltage gradients, radiation intensities, current flow, etc., are considered to be of small amplitude. This is considered to be an advantage when the semiconductor is used as a signal translating device capable of generating, amplifying, modulating and otherwise translating electrical signals, but the present invention contemplates further uses of the semiconductor which is not necessarily limited to such low-level considerations.

Heretofore, the semiconductor concept has been essentially restricted to the bar or plate geometry type in which there are established one or more conducting states, be it electron or hole current flow, by the so called poisoning of pure germanium or silicon single crystals with a doping element such as antimony or arsenic for electron excess in the crystal (N-type) and indium, gallium, or aluminum for a hole or positive excess in the crystal (P-type). By application of a potential applied to or across these conducting states a current flow is developed resulting in an electron flow toward the positive pole, and a hole or positive flow toward the negative pole of the potential difference so impressed to the crystal.

One general object of this invention is to combine semiconductor principles with circuit element characteristics.

A further object of this invention is to provide amplifying, detecting, rectifying, and phasing semiconductor devices which can be inherently incorporated with certain inductive characteristics to provide a single element possessing features of the several units.

Another object of this invention is to provide a semiconductor phasing device.

More specifically an object of this invention is to enable the semiconductor to achieve more and varied uses by providing for new geometrical configurations and thus effect and devise a new electrical characteristic.

The novel features that are considered characteristic of this invention are set forth with particularity in the appended claims. The invention itself, however, both as to organization and method of operation, as well as additional objects and advantages thereof, will best be understood from the following description when read in connection with the accompanying drawings, in which:

Figure 5:
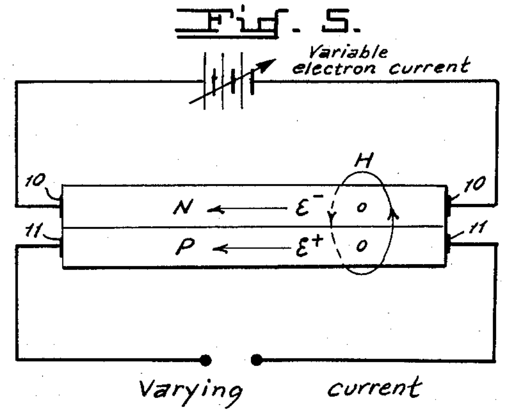
Figure 6:
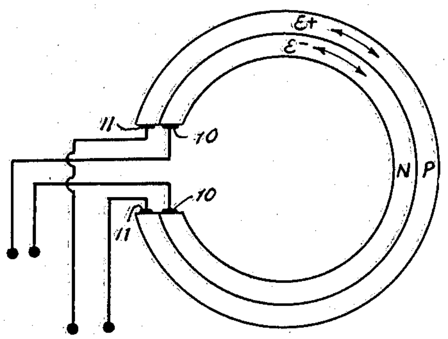
Figure 7:
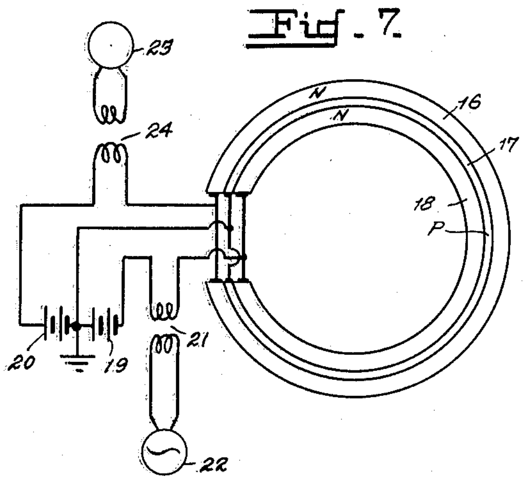
Figure 8:
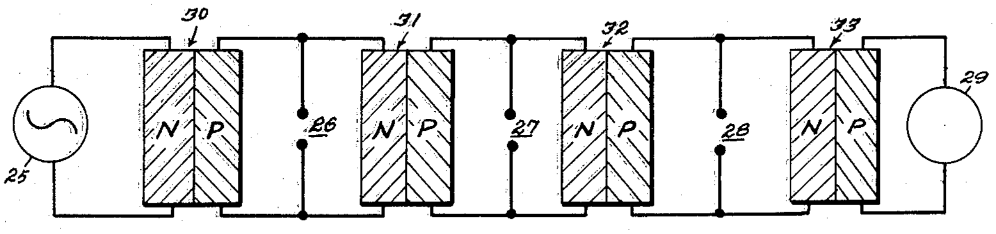

FIGURE 5 exemplifies carrier flow in a semiconductor bar;

FIGURE 6 shows a P–N semiconductor incorporating inductance parameters;

FIGURE 7 shows an N–P–N semiconductor incorporating inductance parameters;

FIGURE 8 shows a phasing sequential device using N–P units in series; and

Figure 9:
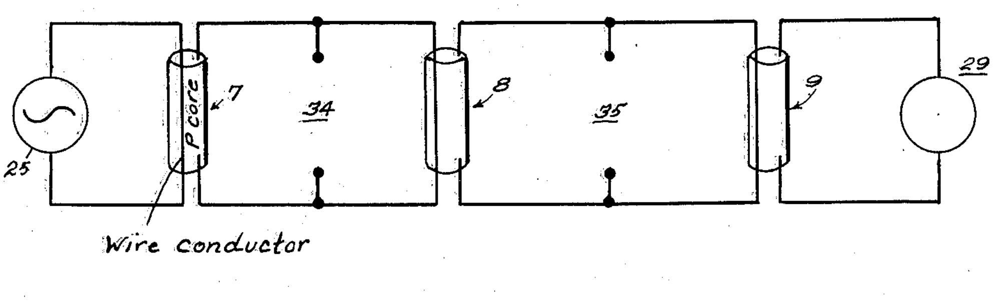

FIGURE 9 shows a phasing sequential device using conductor-P units in series.

Figures 1, 2:
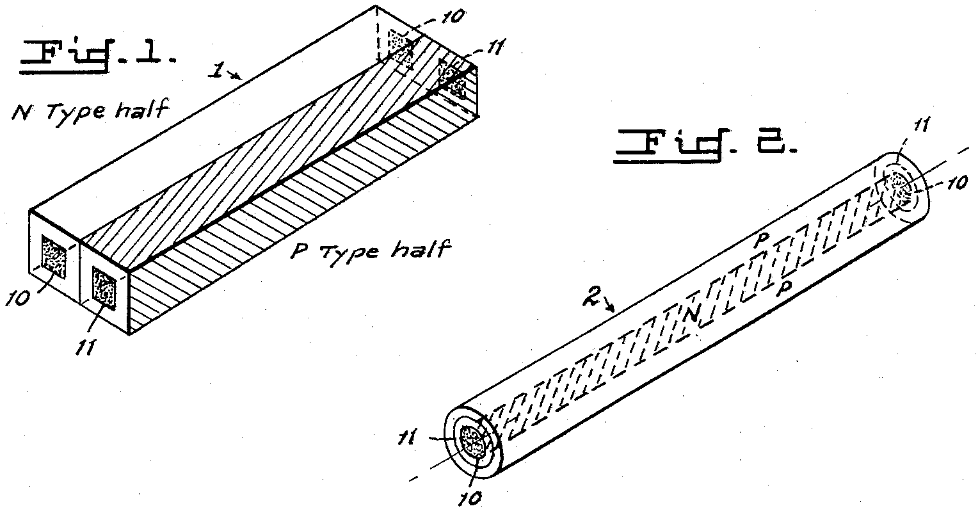
FIGURE 1 is an example of semiconductor material in P and N phases as a bar.
FIGURE 2 is an example of the semiconductor material in a cylindrical form with a core.

Referring now to the drawings in which like components have been designated by the same reference numerals and particularly to FIGURE 1 there is illustrated a properly doped bar 1 of germanium or silicon poisoned by the "p" and "n" type elements so that one-half of the bar is the P-type and the other half is the N-type in the lengthwise direction. This bar can be considered similar to the so-called "junction" diode with regards to its manufacture. It can be produced by a method commonly referred to as "double-doping" which consists of melting a small container of pure germanium and adding a small trace of donor and acceptor impurities. The doped germanium is then caused to solidify under carefully controlled conditions of agitation and temperature. The rate and temperature of the mass is then periodically varied and this growth-rate variation causes different relative concentrations of donors and acceptors to enter into the solidifying crystal. The process therefore creates alternate layers of N- and P-regions which can be shaped in the form of a rectangular bar. Ohmic type contacts are then applied to the bar for connection to a source so that one set 10 is associated exclusively with the N-type crystal half and a separate and similar set 11 is associated with the P-type crystal half and can be connected to any desired utilization device.

FIGURE 2 shows a cylindrical bar 2 of a single crystal such as germanium or silicon with an inner core being of the N-type and the outer section being of the P-type. N ohmic contacts 10 and P ohmic contacts 11 are again supplied to provide for connection to associated input and output circuits. A changing potential may be placed across the N ohmic contacts of FIGURES 1 or 2, as illustrated in FIG. 5, so that a current is devolped through the crystal N half. For example, if a changing potential is applied across this negative excess portion of the crystal, a corresponding electron current will thereupon flow in that portion of the bar. This flow, accompanied by its changing magnetic field, shall then influence an electrical force upon the holes existing in the P or positive excess crystal. The holes will then move in a direction similarly to the electron movement according to Faraday's law and give rise to an electrical potential difference across the P ohmic contacts 11. Any changes in the electron current flow will create a corresponding change in the hole current flow due to the changing magnetic field interaction. In other words, the electron current $\epsilon^-$ varies causing the field H to vary which in turn produces hole motion in the adjacent P-type semiconductor resulting in the varying hole current $\epsilon^+$.

Figure 3:
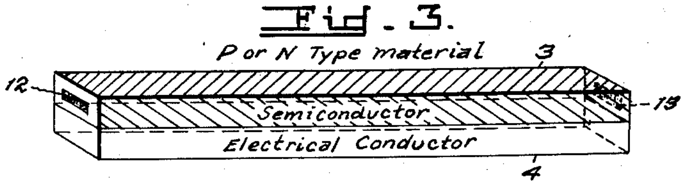
FIGURE 3 is an example of semiconductor material and conductor material in bar form.

This invention is not limited merely to bars composed of two different semiconductor materials. In FIGURE 3 for instance, there is shown a semiconductor bar 3 adjacent to a metallic conductor 4 such as copper. With changing electron current flow through the copper, the magnetic field induces an electron or hole flow respectively, if the semiconductor is of the N- or P-type. By properly placed ohmic contacts 12 and 13 on the semiconductor 3, a potential is developed across this semiconductor.

Figure 4:
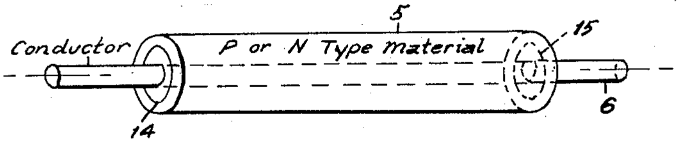
FIGURE 4 shows the same materials as shown in FIGURE 3 but in cylindrical form with a core.

A similar semiconductor electron or hole flow is generated across the semiconductor material 5 when an electron current is transmitted through the metallic conductor core 6 in the cylindrical bar shown in FIGURE 4. Ohmic contacts 14 and 15 properly placed on the sleeve portion surrounding the metallic conductor 6 provide for connection to a suitable output device.

In the modifications shown in FIGURES 3 and 4 it may be desirable to electrically insulate the conductor-semiconductor interface by a thin non-conductive material so as to as to permit only the magnetic field to interact with the electrons or holes of the semiconductor.

By proper choice of geometrical form the instant device can be used as an inductance under the proper conditions. In FIGURE 6 there is shown an adaptation of the phenomena described in connection with FIGURE 1, in which the device is formed in a circular configuration. In this instance the coil shape permits the device to attain the solenoidal characteristics of an inductance. The resonant or tuning characteristic of an A.F., R.F. or I.F. coil is achieved in this manner by presenting a reactive impedance semiconductor component for producing an oscillating interaction of the fields employed when energized properly. The set of N ohmic contacts 10 can be connected to any variable voltage source desired, while the set of P ohmic contacts 11 can be connected to the remainder of the circuitry. With the proper selection of inductance parameters and assisted by proper selection of inherent internal capacity parameter, and if need be external capacitive coupling, the semiconductor so described will be a reactive circuit component. The single coil shown in FIGURE 6 can be extended to a multitude of turns to produce an increased reactive impedance as desired. If desired, one of the semiconductors may be replaced with a conductor, as described relative to FIGS. 3 and 4.

The teaching of this invention can be further extended to the use of a semiconductor in transistor applications. In FIGURE 7 for instance there is shown the adaptation of a common N–P–N type transistor in which the materials are formed into a circular shape or ring. The transistor includes an emitter 16, base 17, and collector 18. Proper bias for the emitter-base and collector-base junctions are supplied by voltage sources 19 and 20 respectively. A transformer 21 is used to couple a signal from any source, such as an A.C. generator designated at 22, to the emitter 16 of the transistor. The output of the transistor is designated generally at 23 and is removed from the collector 18 by means of a transformer 24. This novel form of the semiconductor introduces a new parameter not heretofore subscribed to the present types of transistors, namely that of an inductance. With this new incorporation of semiconductor characteristics there is produced a transistor that is inherently possessed with an inductance. This shape thereby allows the transistor to have a tunable A.F., R.F. or I.F. range of selection and usefulness to the art. Other semiconductor variations, such as the P–N–P, N–P–N–P, etc. types, are reducible to this circular shape to add the inductive reactance characteristics to their inherent capabilities.

From the description of FIGURE 1 it can be noted that in the arrangement of a semiconductor where the N-portion is intimately adjacent and parallel to a P-portion there is provided a phase lagging current in the P-portion when a changing current is applied through the parallel N-portion. In this instance the flow of the electrons energize, along with their associated magnetic field, the parallel motion or flow of the holes, when the electron flow is varying. However, due to the much lower mobility velocity of the holes compared to that of the conducting electrons, a phase difference is introduced into the circuit. As noted in the Transistor Manual, General Electric Company Report ECG187, an electrical field of 1 volt/cm. in germanium will cause an electron to move at a rate of 3600 cm./sec. while a hole will only move at 1700 cm./sec. In this manner a varying signal or potential across the N-portion will produce a lagging potential or counterpart across the P-portion. With such a unit as an N–P parallel device it is then possible to obtain a phase lag or difference that is novel and useful which heretofore has only been electrically possible by the use of inductance or capacitance units.

When several of these N–P devices are connected in series it is possible to achieve an increasing phase difference in the electrical signal or current initially applied to the first device by tapping off from the succeeding N–P devices for the phase difference desired. In FIGURE 8 an input signal is supplied by the A.C. source 25 to the N–P devices 30–33, each of which supplies a desired phase shift. This phasing sequential device then provides progressive phase lags which can be tapped off at junctions 26, 27, 28 with the final output being provided at any utilization device 29.

If desired conductor —P units can be connected in series to provide a phasing sequential device. FIGURE 9 shows such a device where A.C. source 25 supplies the input signal to conductor —P units 7–9 connected in series. Progressive phase lags are then tapped off at junctions 34 and 35 with the final output being provided at utilization device 29.

It is to be understood that the illustrated configurations are also applicable to the new materials that have been introduced as substitutes for the inorganic semiconductors such as polymeric or plastics in which electrons or holes can also be produced by suitable poisoning of the parent material.

Although specific embodiments of this invention have been illustrated and described, it will be understood that they are but illustrative and the various modifications may be made therein without departing from the scope and spirit of this invention.

What is claimed is:

1. A semiconductor device comprising a first elongated body of material which is semiconductive in nature, a second elongated body of material which is adjacent to and contiguous of said first elongated body, said first and second bodies being shaped substantially as a ring, thereby providing a reactive circuit component, a first pair of ohmic contacts being provided, one on each end of said first elongated body, for connection to a utilization device, and a second pair of ohmic contacts being provided on said second body for connection to a signal source, wherein current carriers in said first elongated body when subjected to a varying potential across said first pair of ohmic contacts will influence an electrical force upon the current carriers in said second body giving rise to an electrical potential difference across said second pair of ohmic contacts.

2. A device as defined in claim 1 wherein said second elongated body of material is semiconductive in nature.

3. A device as defined in claim 1 wherein said second elongated body of material is conductive in nature.

4. A device as defined in claim 2 further comprising a third elongated body of material which is of the same semiconductive nature as said first body, said third being adjacent to and contiguous of said second elongated body and on the opposite side thereof with respect to said first body wherein said first, second and third bodies are formed in the shape of a ring thereby providing a transistor with the inherent capabilities of an inductance.

5. A device as defined in claim 2 further comprising a source of signal voltage connected to said second pair of ohmic contacts, and a plurality of said semiconductor devices being connected to said first pair of ohmic contacts in cascade fashion to provide a phasing sequential device wherein a lagging phase difference of said source of signal may be tapped off between said plurality of semiconductor devices as desired.

References Cited in the file of this patent

UNITED STATES PATENTS

| | | |
|---|---|---|
| 2,987,659 | Teszner | June 6, 1961 |
| 3,061,739 | Stone et al. | Oct. 30, 1962 |

OTHER REFERENCES

"Transmitted Phonon Drag Measurements in Silicon," by Kurt Hubner et al., Physical Review Letters, vol. 4, No. 10, May 15, 1960 (pages 504 and 505).